(12) United States Patent
Lyul

(10) Patent No.: US 10,564,498 B2
(45) Date of Patent: Feb. 18, 2020

(54) DISPLAY SYSTEMS AND RELATED METHODS INVOLVING BUS LINES WITH LOW CAPACITANCE CROSS-OVER STRUCTURES

(71) Applicant: a.u. Vista Inc., Milpitas, CA (US)

(72) Inventor: Lee Seok Lyul, Hsin-Chu (TW)

(73) Assignee: A.U. VISTA INC., Milpitas, CA (US)

( * ) Notice: Subject to any disclaimer, the term of this patent is extended or adjusted under 35 U.S.C. 154(b) by 0 days.

(21) Appl. No.: 15/213,561

(22) Filed: Jul. 19, 2016

(65) Prior Publication Data

US 2018/0024406 A1  Jan. 25, 2018

(51) Int. Cl.
| | | |
|---|---|---|
| G02F 1/1362 | (2006.01) | |
| G02F 1/1343 | (2006.01) | |
| G02F 1/1368 | (2006.01) | |
| H01L 27/12 | (2006.01) | |

(52) U.S. Cl.
CPC ...... *G02F 1/136286* (2013.01); *G02F 1/1368* (2013.01); *G02F 1/134336* (2013.01); *H01L 27/124* (2013.01); *H01L 27/1288* (2013.01); *G02F 2001/13629* (2013.01); *G02F 2001/136295* (2013.01)

(58) Field of Classification Search
CPC ......... G02F 1/136286; G02F 1/134309; G02F 1/134336; G02F 2001/13606; H01L 23/5222; H01L 23/5221; H01L 23/5283; H01L 27/124
See application file for complete search history.

(56) References Cited

U.S. PATENT DOCUMENTS

| | | | | |
|---|---|---|---|---|
| 5,002,367 | A | * | 3/1991 | Nicholas ............... G02F 1/1362 174/261 |
| 6,380,559 | B1 | * | 4/2002 | Park .................... G02F 1/13458 257/59 |
| 7,843,519 | B2 | | 11/2010 | He et al. |
| 2015/0062522 | A1 | | 3/2015 | You et al. |
| 2015/0079732 | A1 | | 3/2015 | Chae et al. |

FOREIGN PATENT DOCUMENTS

| | | |
|---|---|---|
| TW | M396975 U | 1/2011 |
| TW | I1406077 B1 | 8/2013 |
| TW | I430448 B | 3/2014 |

OTHER PUBLICATIONS

CN Office Action dated Mar. 29, 2019 in Chinese application (No. 201710432362.1).

* cited by examiner

*Primary Examiner* — Monica D Harrison
*Assistant Examiner* — John Lin
(74) *Attorney, Agent, or Firm* — McClure, Qualey & Rodack, LLP

(57) ABSTRACT

Display systems and related methods involving bus lines with low capacitance cross-over structures are provided. A representative display system includes: a first structure comprising: a plurality of scan lines extending in a first direction; and a plurality of data lines extending in a second direction and crossing over the scan lines at respective cross-over locations, each of the plurality of data lines having a pair of side walls spaced apart from each other at each of the cross-over locations, with each of the side walls exhibiting a height higher than portions of the data lines not located at the cross-over locations.

19 Claims, 9 Drawing Sheets

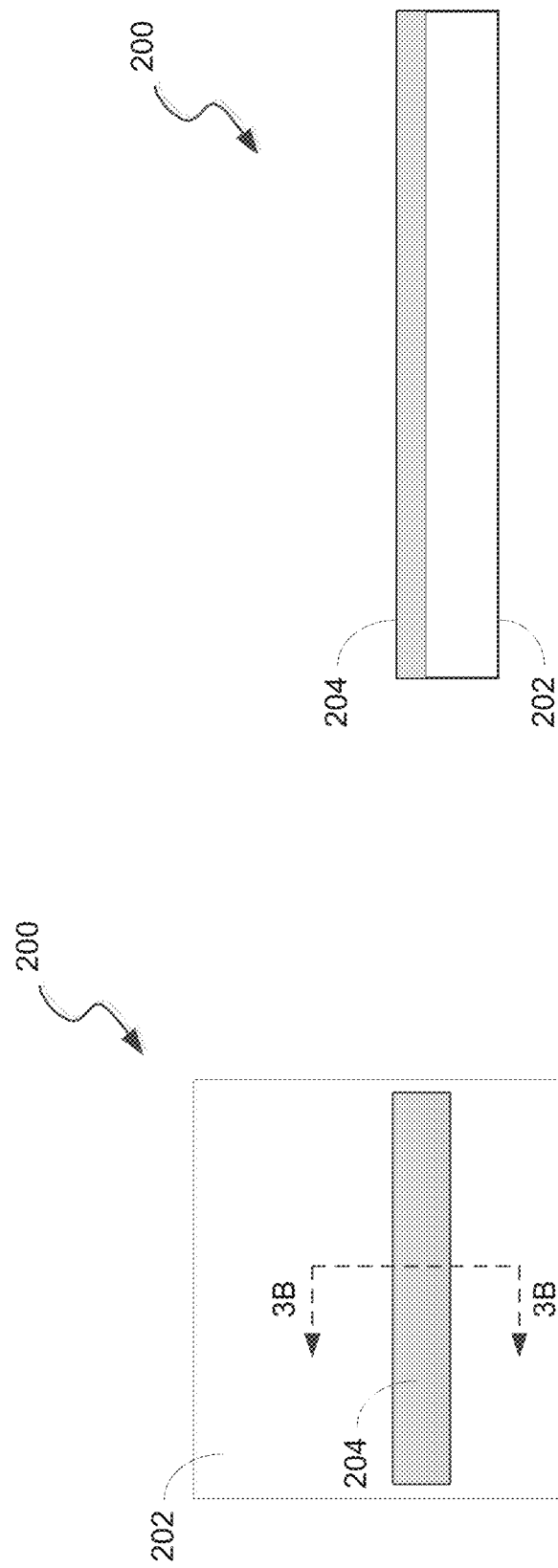

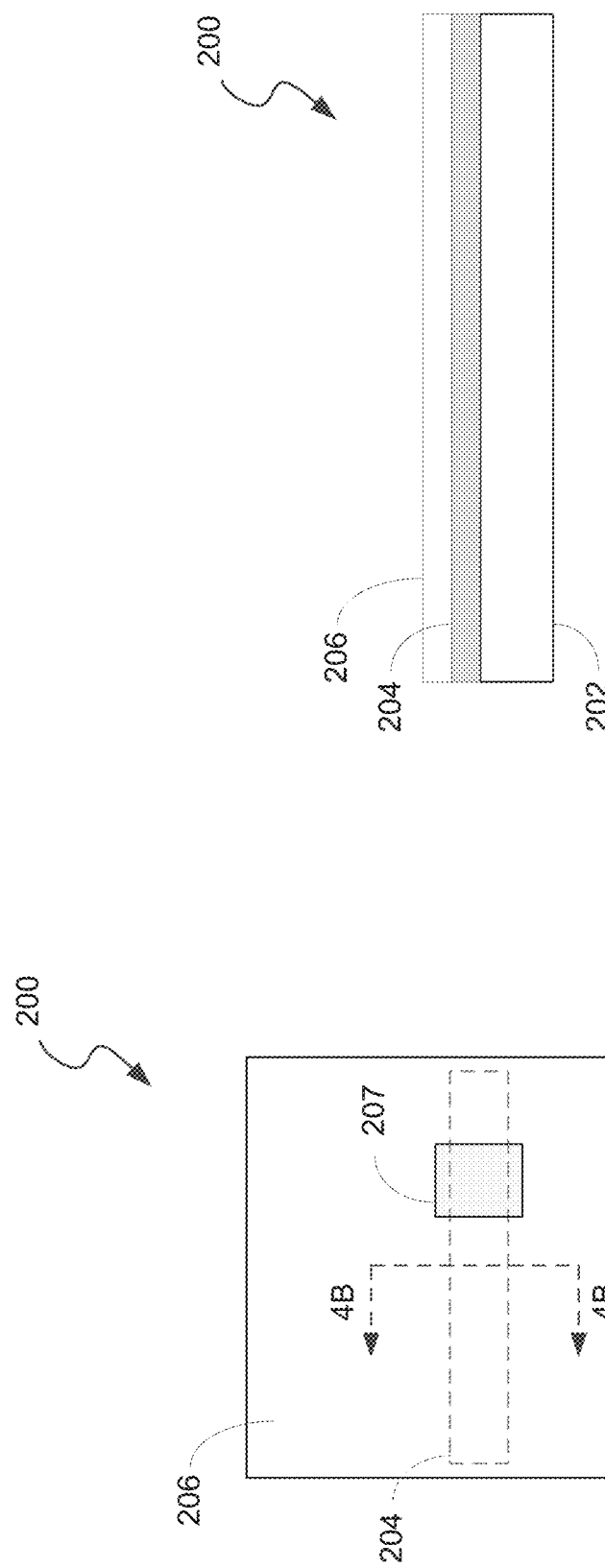

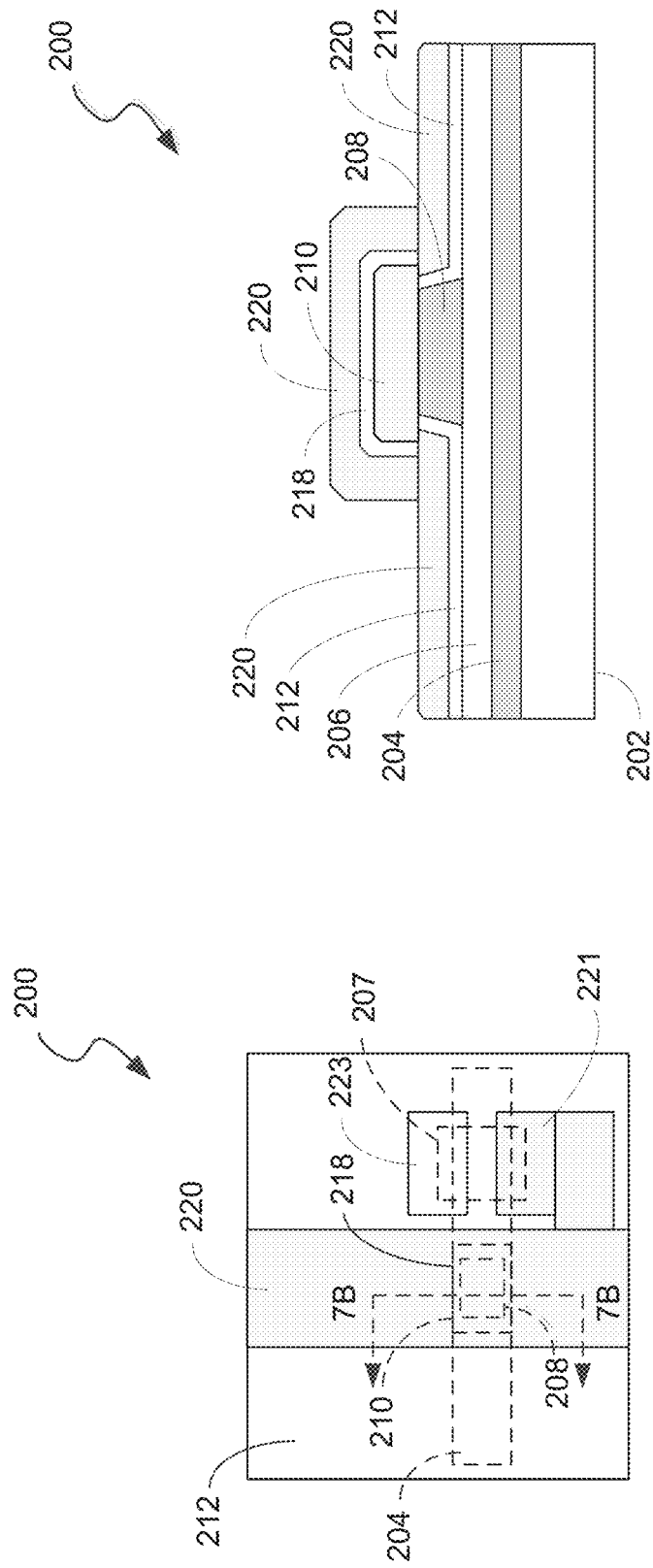

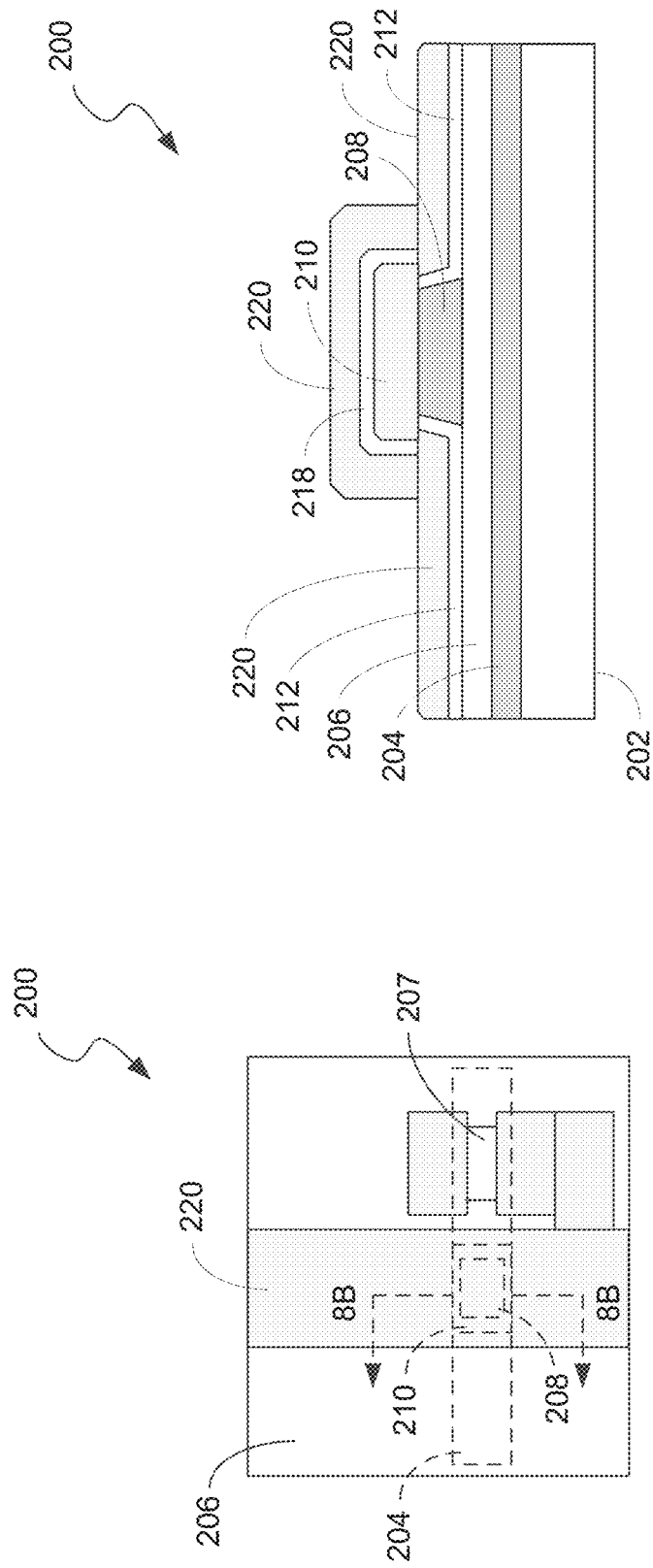

DISPLAY SYSTEMS AND RELATED METHODS INVOLVING BUS LINES WITH LOW CAPACITANCE CROSS-OVER STRUCTURES

BACKGROUND

Technical Field

The disclosure generally relates to signal lines of display panels.

Description of the Related Art

Displays, such as liquid crystal displays (LCDs), are widely used in electronic devices, such as laptops, smart phones, digital cameras, billboard-type displays, and high-definition televisions. In addition, electroluminescent displays such as OLEDs are also gaining in public attention.

LCD panels may be configured as disclosed, for example, in Wu et al., U.S. Pat. No. 6,956,631, which is assigned to AU Optronics Corp., the parent company of the assignee of the current application, and hereby incorporated by reference in its entirety. As disclosed in Wu et al. FIG. 1, the LCD panel may comprise a top polarizer, a lower polarizer, a liquid crystal cell, and a back light. Light from the back light passes through the lower polarizer, through the liquid crystal cell, and then through the top polarizer. As further disclosed in Wu et al. FIG. 1, the liquid crystal cell may comprise a lower glass substrate and an upper substrate containing color filters. A plurality of pixels comprising thin film transistor (TFT) devices may be formed in an array on the glass substrate, and a liquid crystal compound may be filled into the space between the glass substrate and the color filter forming a layer of liquid crystal material.

Still, the structure of TFTs in displays may be various. For instance, The TFTs, gate and data lines, and pixel electrodes may be formed in a multilayer structure such as that shown in FIGS. 1 and 2E of Lai et al., U.S. Pat. No. 7,170,092 and in its division U.S. Pat. No. 7,507,612, both of which are assigned to AU Optronics Corp., the parent company of the assignee of the current application, and both of which are hereby incorporated by reference in their entireties. The multilayer structure may comprise a first conducting layer, a first insulating layer, a semiconductor layer, a doped semiconductor layer, and a second conducting layer disposed in sequence on the substrate. It may further comprise a second insulating layer and a pixel electrode disposed on the second insulating layer. The first conducting layer may comprise at least one of a gate line or a gate electrode. The doped semiconductor layer may comprise a source and a drain. The second conducting layer may comprise a source electrode and a drain electrode. The multilayer structure may be formed using a series of wet and dry etching processes, for example as disclosed in Lai et al. FIGS. 2A-2D.

Additional techniques for forming TFTs are disclosed in Chen, U.S. Pat. No. 7,652,285, which is assigned to AU Optronics Corp., the parent company of the assignee of the current application, and hereby incorporated by reference in its entirety. As disclosed in Chen, to form the channel of the TFT, the second metal layer is etched in order to open a portion of the second metal layer over the gate electrode and to separate the source region and drain region. This etching can be performed in multiple ways, including the back-channel etching process disclosed for example in Chen FIGS. 2A-2E and the etch stop process disclosed for example in Chen FIGS. 5A-5D and 6. Chen discloses that TFT leakage currents may be reduced by adding a spacer layer formed at the sidewalls of the conductive doped amorphous silicon layer, isolating the conductive amorphous silicon layer from the insulating layer. Chen discloses that this spacer layer can be formed by oxidizing the exposed surface of the conductive amorphous silicon layer after the etch of the second metal layer is performed. Chen discloses that this surface may be oxidized by a number of different techniques, including oxygen plasma ashing, or the use of ozone plasma in the presence of carbon tetrafluoride and sulfur hexafluoride gases As explained in Sawasaki et al., U.S. Pat. No. 7,557,895, which is assigned to AU Optronics Corp., the parent company of the assignee of the current application, and hereby incorporated by reference in its entirety, the thickness of the liquid crystal layer typically must be uniformly controlled, in order to avoid unevenness in brightness across the LCD panel. As disclosed in Sawasaki et al., the required uniformity may be achieved by disposing a plurality of pillar spacers between the TFT substrate and the color filter substrate. As further disclosed in Sawasaki et al., the pillar spacers may be formed with different heights, such that some spacers have a height that is greater than the gap between the substrates and other spacers have a height that is less than the gap between the substrates. This configuration may permit the spacing between the substrates to vary with temperature changes but also prevent excessive deformation when forces are applied to the panel.

Sawasaki et al. further discloses a method for assembling the substrates with the liquid crystal material between them. This method comprises steps of preparing the two substrates, coating a sealing material on the circumference of the outer periphery of one of the pair of substrates, dropping an appropriate volume of liquid crystal on one of the pair of substrates, and filling in the liquid crystal between the pair of substrates by attaching the pair of substrates in a vacuum followed by returning the attached pair of substrates to atmospheric pressure.

In LCD panels, the semiconductor material making up the TFT channel may be amorphous silicon. However, as disclosed in Chen, U.S. Pat. No. 6,818,967, which is assigned to AU Optronics Corp., the parent company of the assignee of the current application, and hereby incorporated by reference in its entirety, poly-silicon channel TFTs offer advantages over amorphous silicon TFTs, including lower power and greater electron migration rates. Poly-silicon may be formed by converting amorphous silicon to poly-silicon via a laser crystallization or laser annealing technique. Use of the laser permits fabrication to occur at temperatures below 600° C., and the fabricating technique is thus called low temperature poly-silicon (LTPS). As disclosed in Chen, the re-crystallization process of LTPS results in the formation of mounds on the surface of the poly-silicon layer, and these mounds impact the current characteristics of the LTPS TFT. Chen discloses a method to reduce the size of the LTPS surface mounds, by performing a first anneal treatment, then performing a surface etching treatment, for example using a solution of hydrofluoric acid, and then performing a second anneal treatment. The resulting LTPS surface has mounds with a height/width ratio of less than 0.2. A gate isolation layer, gate, dielectric layer, and source and drain metal layers can then be deposited above the LTPS layer to form a complete LTPS TFT.

As disclosed in Sun et al., U.S. Pat. No. 8,115,209, which is assigned to AU Optronics Corp., the parent company of the assignee of the current application, and hereby incorporated by reference in its entirety, a disadvantage of LTPS TFTs compared to amorphous silicon TFTs is a relatively large leakage current during TFT turn off. Use of multiple gates reduces leakage current, and Sun et al. discloses a number of different multi-gate structures for a polycrystalline silicon TFT, including those shown in Sun et al. FIGS. 2A-2B and 3-6.

An alternative to LCD devices is the active matrix organic light-emitting device (OLED), as disclosed for example in Huang, U.S. Pat. No. 6,831,410, which is assigned to AU Optronics Corp., the parent company of the assignee of the current application, and hereby incorporated by reference in its entirety. As disclosed in Huang, a TFT is formed over a substrate. An insulating layer is formed, covering the TFT. A contact opening is formed in the insulating layer, exposing the drain terminal of the TFT, and an anode layer is formed over the insulating layer and the exposed opening, forming a contact between the anode layer and the TFT drain terminal. A light-emitting layer is formed over the anode layer, and a cathode layer is formed over the light-emitting layer. As explained in Huang, there is a risk that the cathode layer will form a short circuit with the anode layer via the contact opening. To prevent such short circuits, Huang discloses depositing a planarization layer that fills the space above the contact. The light-emitting and cathode layers are then formed over the planarization layer.

As display size is increased, various problems may become evident. For instance, as line resistance and line capacitance increase due to the increased line lengths, capacitive and loading effects on scan and data lines of a display may implicate scan line delay. In particular, rise time of a scan line driving signal may be slowed or delayed to such an extent (e.g., greater than $0.1\ T_{scan}$) that luminance non-uniformity, flicker, cross-talk and/or image retention problems are exhibited.

SUMMARY

Display systems and related methods involving bus lines with low capacitance cross-over structures are provided. In one embodiment, a display system comprises: a first structure comprising: a plurality of scan lines extending in a first direction; and a plurality of data lines extending in a second direction and crossing over the scan lines at respective cross-over locations, each of the data lines having a pair of side walls spaced apart from each other at each of the cross-over locations, with each of the side walls exhibiting a height higher than portions of the data lines not located at the cross-over locations.

Another embodiment of a display system comprises: a substrate; a scan line supported by the substrate and extending in a first direction; a data line supported by the substrate and extending in a second direction such that the data line crosses over the scan line at a cross-over location; and gate insulation disposed between the scan line and the data line; wherein the data line has a first section, a second section and an interconnect section electrically interconnecting the first section and the second section, the interconnect section being disposed at the cross-over location, the interconnect section having side walls defining an aperture, the side walls extending higher than heights exhibited by the first section and the second section.

In another embodiment, a method for manufacturing a display system comprises: providing a substrate; supporting a first metal layer with the substrate to form a plurality of scan lines extending in a first direction; providing a bump over each of the scan lines; and providing a second metal layer with a portion of the layer extending partially over an exterior of each of the bumps to form a plurality of data lines extending in a second direction and crossing over the scan lines at respective cross-over locations such that the second metal layer forms side walls spaced apart from each other by a corresponding one of the bumps for each of the data lines.

Other objects, features, and/or advantages will become apparent from the following detailed description of the preferred but non-limiting embodiments. The following description is made with reference to the accompanying drawings.

BRIEF DESCRIPTION OF THE DRAWINGS

FIGS. 3A-3B through 9A-9B are schematic, cross-sections (as viewed along section lines similar to section line 3-3 of FIG. 2) showing representative process steps for manufacturing an embodiment.

DETAILED DESCRIPTION

For ease in explanation, the following discussion describes embodiments of the present disclosure in the context of a display system, such as a liquid crystal display (LCD) system or organic light emitting diode (OLED) display system. It is to be understood that the invention is not limited in its application to the details of the particular arrangements shown since the invention is capable of other embodiments. Also, the terminology used herein is for the purpose of description and not of limitation.

In this regard, display systems and related methods involving bus lines with low capacitance cross-over structures are provided. In some embodiments, the bus lines may incorporate side walls that interconnect segments of bus lines at cross-over locations. So configured, capacitance of the lines at the cross-over locations may be reduced without significantly increasing resistance. Exemplary embodiments will now be described with reference to the drawings.

Figure 1:
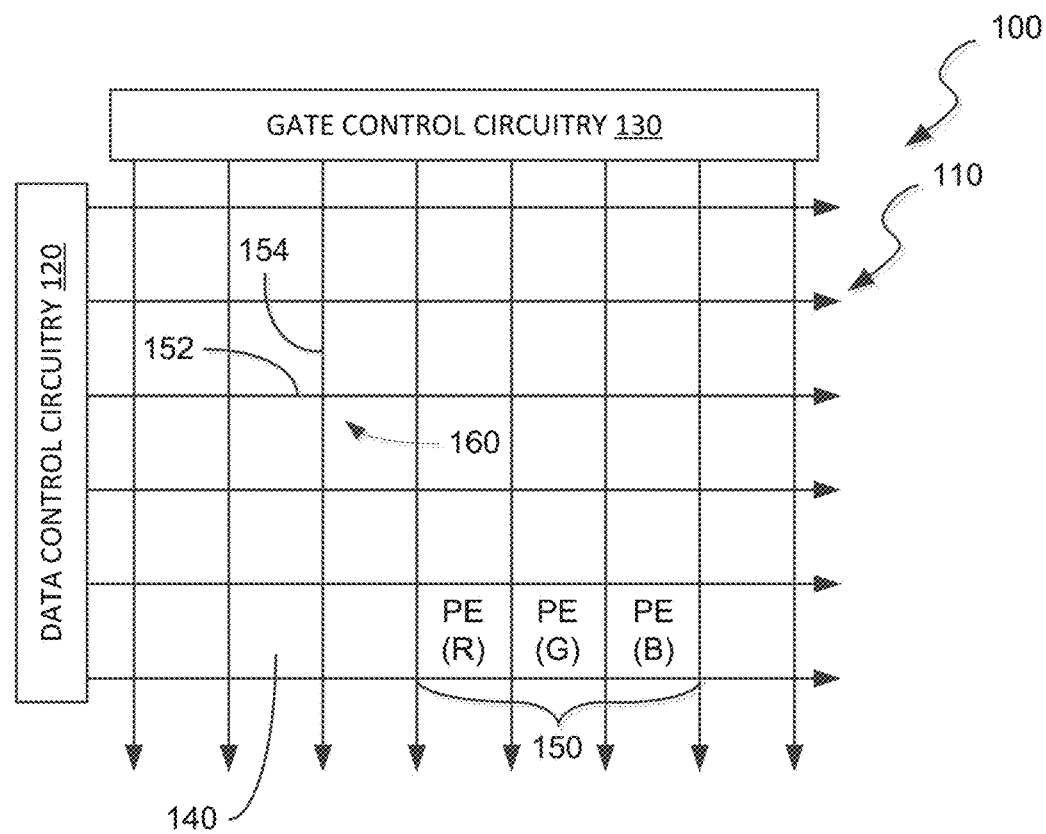
FIG. 1 is a schematic diagram of an embodiment of an LCD system.

With reference to FIG. 1, an embodiment of a display system 100 configured as an LCD panel is depicted. Fundamentally, display system 100 includes an LCD panel 110 with a plurality of pixels, data control circuitry 120 and gate control circuitry 130. The circuits and functions can be implements by hardware, software or a combination of hardware and software such as microcontrollers, application-specific integrated circuits (ASIC) and programmable microcontrollers.

LCD panel 110 incorporates a plurality of pixels (typically thousands of pixels, e.g., pixels 140, 150), which are arranged in a two-dimensional array comprising a plurality of rows and columns. For ease of illustration, only a few pixels are shown. As is known, in a thin film transistor (TFT) LCD panel, a pixel is typically formed from three pixel elements (PEs): one red, one green, and one blue, although various configurations may be used. For instance, pixel 150 is depicted as including three PEs-PE(R), PE(G) and PE(B). One or more transistors and one or more storage capacitors are typically coupled to each pixel element, thereby forming driving circuitry for the associated pixel element.

The transistors of all pixels in a given row typically are connected to bus lines—their gate electrodes are connected to a gate (scan) line (e.g., line 154), and their source electrodes are connected to a source (data) line (e.g., line 152). The gate control circuitry 130 and data control circuitry 120 control the voltage applied to the respective gate and data bus lines to individually address each pixel element in the LCD panel. By controllably pulsing the respective pixel element driving transistors, the driving circuits can control the transmissivity of each PE, and thereby control the color of each pixel. The storage capacitors assist in maintaining the charge across each pixel between successive pulses (which are delivered in successive frames). Common lines (not shown) provide reference (common) signals for the electrodes.

Figure 2:
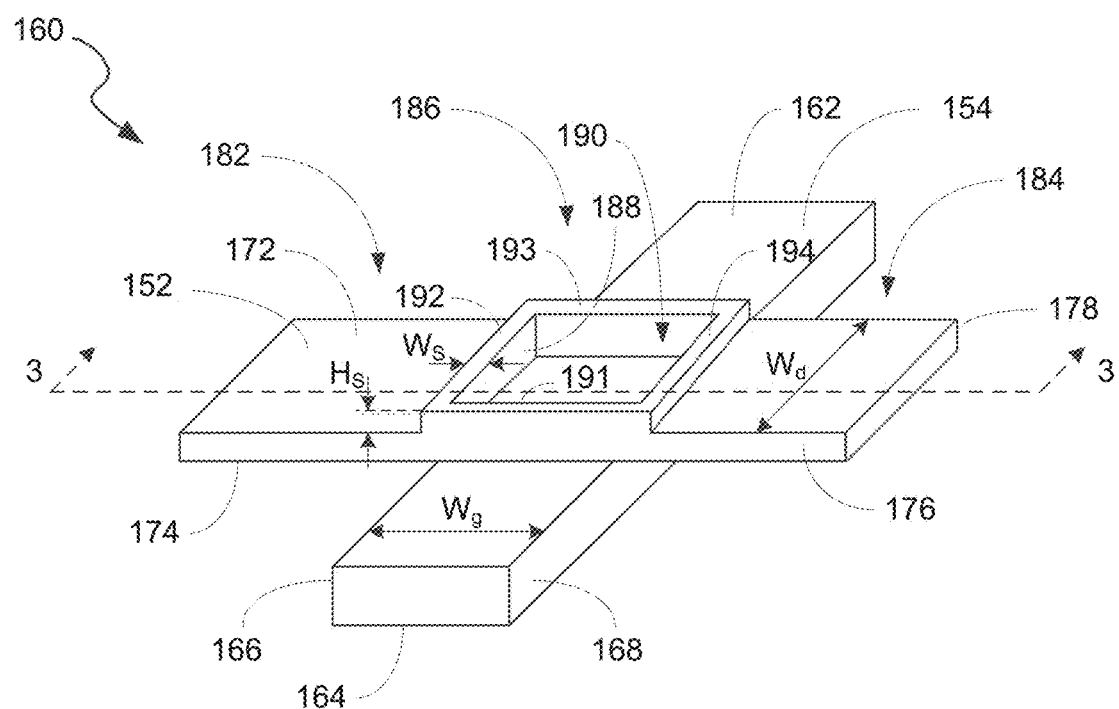
FIG. 2 is a schematic diagram of the embodiment of FIG. 1 showing detail of a bus cross-over location.

A portion of the embodiment of FIG. 1 is depicted schematically in FIG. 2, in which detail of a bus cross-over location 160 is presented. In particular, as shown in FIG. 2, gate line 154 extends in a first direction and is provided as a strip of material that exhibits generally uniform rectangular cross-sections along its length. Gate line 154 includes top and bottom (generally planar) surfaces 162 and 164, respectively, and opposing side surfaces 166 and 168 that are substantially parallel to each other. Gate line 154 exhibits a width $W_g$.

As shown in FIG. 2, data line 152 extends in a second direction that is generally perpendicular to the first direction of gate line 154, although other configurations may be used in other embodiments. Data line 152 includes top and bottom (generally planar) surfaces 172 and 174, respectively, and opposing side surfaces 176 and 178 that are substantially parallel to each other. Data line 152 exhibits a width $W_d$.

Data line 152 incorporates first and second segments (182 and 184, respectively) each of which exhibits generally uniform rectangular cross-sections along its length. A cross-over segment 186 interconnects segments 182, 184, with cross-over segment 186 being positioned at cross-over location 160 (i.e., the location at which data line 152 crosses over gate line 154). It should be noted that although not depicted for ease of illustration, one or more of various other materials and/or features may be provided at a cross-over location, such as a gate insulating material disposed between lines 152 and 154, for example.

Cross-over segment 186 includes an aperture 188 that defines a void 190 (which may be at least partially filled in some embodiments) that is positioned over gate line 154. In this embodiment, aperture 188 is generally rectangular in plan view and incorporates inner surfaces of side walls 191, 192, 193 and 194. Specifically, side walls 191 and 193 are aligned with the second direction and form the interconnecting structure of cross-over segment 186 as side walls 191 and 193 span the width of gate line 154 to electrically connect segments 182 and 184. Side walls 192 and 194 are aligned with the first direction and are positioned outboard of gate line 154.

Each of the side walls 191-194 protrudes upwardly from surface 172 and exhibits a height ($H_s$) (not including the thickness of data line 154) of between approximately 1 μm and approximately 5 μm (e.g., approximately 3.0 μm), and a width ($W_s$) of between approximately 0.1 μm and approximately 0.7 μm (e.g., approximately 0.3 μm). By providing the sidewalls, line resistance of the cross-over segment may be controlled (e.g., reduced) while improving the mechanical stability of line 152 in the vicinity of vid 190.

In contrast to conventional bus cross-overs that exhibit a capacitance (C) of $\varepsilon(S/d)$, where $\varepsilon$ is the dielectric constant between the lines, S is the overlapping surface area of the lines and d is the distance separating the lines, thus $\varepsilon((w_d \cdot w_g)/d)$, the embodiment of FIG. 2 exhibits a capacitance of $\varepsilon((2 \cdot w_s \cdot w_g)/d)$, where $2 \cdot w_s < w_d$. In some embodiments, the reduction in surface area of the cross-over segment when compared to a conventional line of uniform area (a relationship of $2 \cdot w_s$ to $w_d$) can result in a reduction in capacitance of between approximately 20% and approximately 60% (e.g., approximately 40%). Of significance, this may be accomplished without significantly increasing (and in some cases maintaining) line resistance owing to the increase in conductive line material used (e.g., the material used in forming the extended height of the side walls 191 and 193).

FIGS. 3A-3B through 9A-9B are schematic, cross-sections showing representative process steps for manufacturing an embodiment of a display system. Each cross-section shown in FIGS. 3B-9B is respectively observed from the cross-section lines 3B-3B through 9B-9B marked in FIGS. 3A-9A. As shown in FIGS. 3A and 3B, a representative first step in the process involves providing a substrate 202 and forming a first metal layer 204 on an upper surface of the substrate. Metal layer 204, which may comprise Al, Cu, Mo or metal alloy, for example, may be deposited by sputtering or thermal evaporation. Metal layer 204 is used to form a gate line.

In FIGS. 4A-4B, a gate insulation layer 206 is deposited on a top surface of metal layer 204. Additionally, a semiconductor device 207 (for example, an active layer configured as a channel of a switching device such as a thin film transistor (TFT)) also is formed. The material of the semiconductor device 207 may be, for example, amorphous Silicon, low temperature poly-Silicon or Indium Gallium Zinc oxide.

Figure 5B:
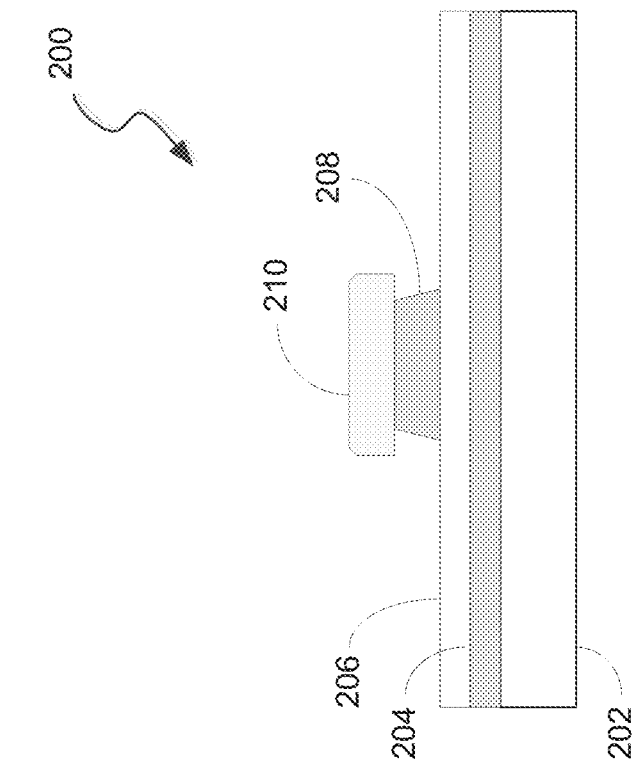
Figure 5A:
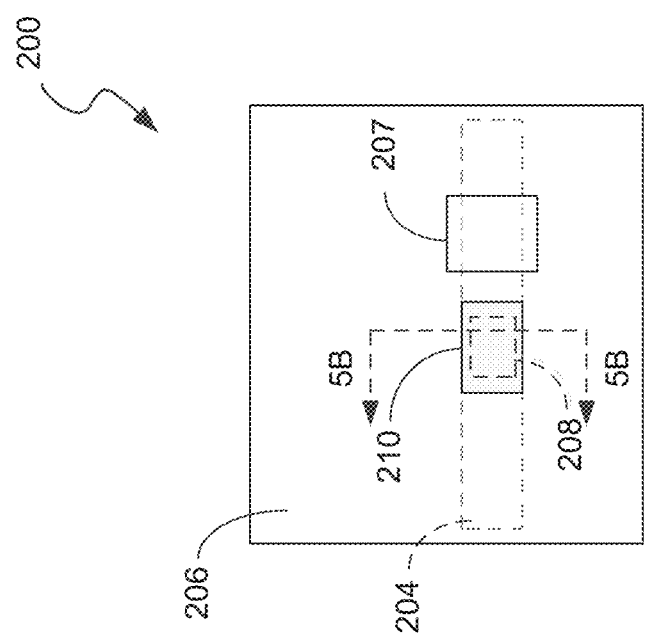

In FIGS. 5A-5B, a bump 208 is formed over the gate insulation layer 206. The bump 208 is made of an organic layer. The organic layer is formed over the gate insulation layer 206. The organic layer, which may be acrylate, epoxy or siloxane, for example, is formed by spin coating or slit coating. The organic layer is configured in the form of a bump 208 with a height of approximately 2-3 μm. Also depicted in FIG. 3C is a layer of photoresist 210 deposited on top of bump 208. Notably, the photoresist applied to the bump exhibits an overhang portion.

Figure 6B:
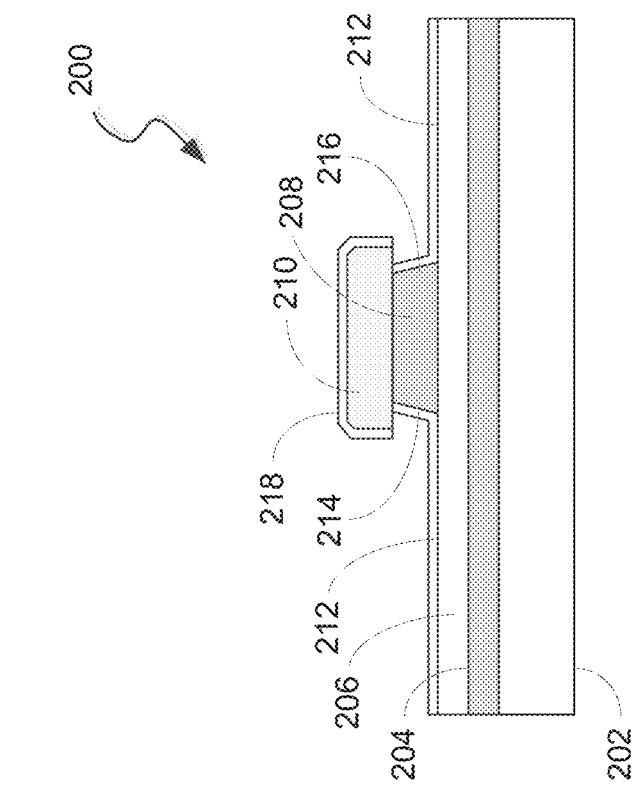
Figure 6A:
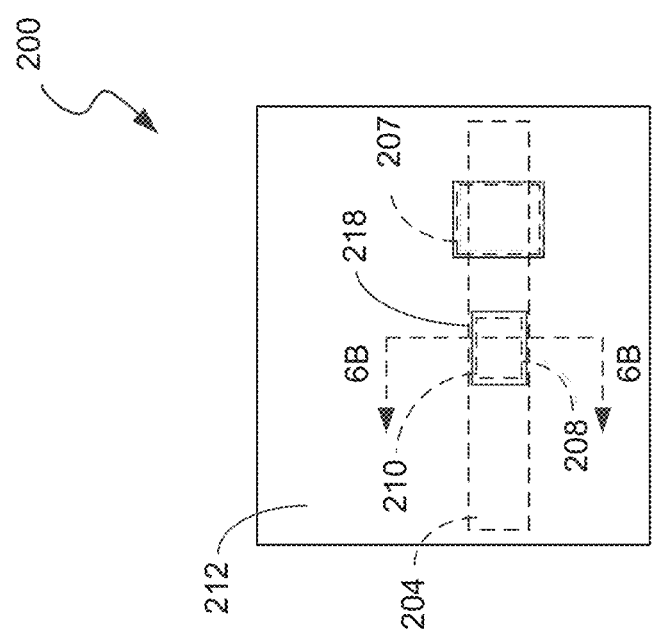

As shown in FIGS. 6A-6B, a second metal layer 212 is deposited. By way of example, the metal may be Al, Cu or metal alloy, for example. Notably, metal layer 212 adheres to the side walls (e.g., side walls 214, 216) of bump 208, and forms a cap 218 about the exposed upper surfaces of photoresist 210.

In FIGS. 7A-7B, photoresist 220 is applied to facilitate formation of a data line, a source electrode 221 and a drain electrode 223 of a TFT, which are formed after metal etching is performed as depicted in FIGS. 8A-8B, which removes material down to the gate insulation layer in areas not covered by the photoresist. The photoresist is subsequently removed by stripper as shown in FIGS. 9A-9B.

Figures 9A, 9B:
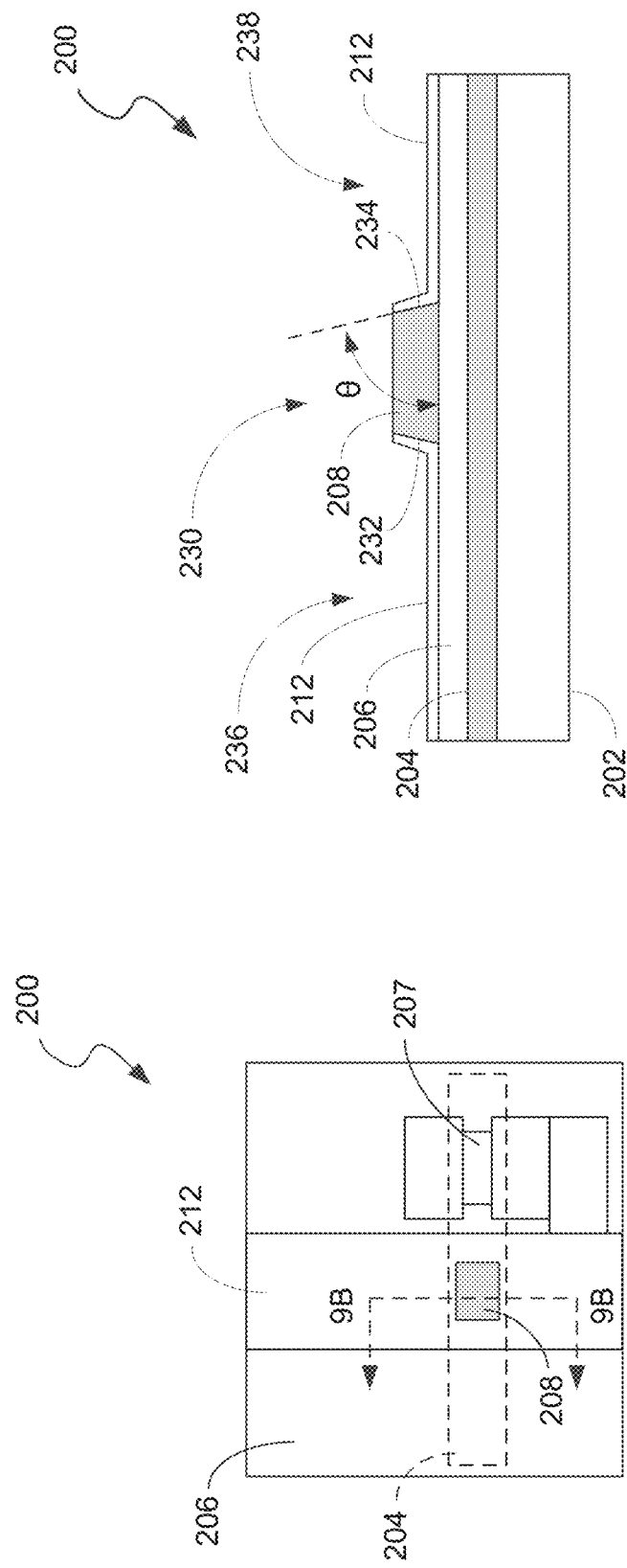

As shown in FIGS. 9A-9B, in addition to the photoresist 210 and 220 being removed, the cap 218 is removed along with the photoresist (this removal technique is known as the lift-off method). Thus, the remaining structure incorporates substrate 202, metal layer 204 (configured as a gate line), gate insulation layer 206, bump 208 and metal layer 212 (configured as a data line).

The data line formed from metal layer 212 incorporates a cross-over segment 230 that includes side walls (e.g., side walls 232 and 234). Cross-over segment 230 electrically interconnects segments 236 and 238 of the data line using side walls similar to side walls 232 and 234 (although the interconnecting side walls are not illustrated in FIG. 3F due to the cross-sectional perspective. The side walls extend outwardly from the generally planar top surface of the data line and may be inclined inwardly toward each other, such that each exhibits an angle (θ) of between approximately 45 and approximately 90 degrees, preferably between approximately 70 and approximately 90 degrees. The angle of inclination of the side walls is determined, at least in part, by the angle of the exterior surface of the bump that is in contact with the metal layer 212.

Figure 10:
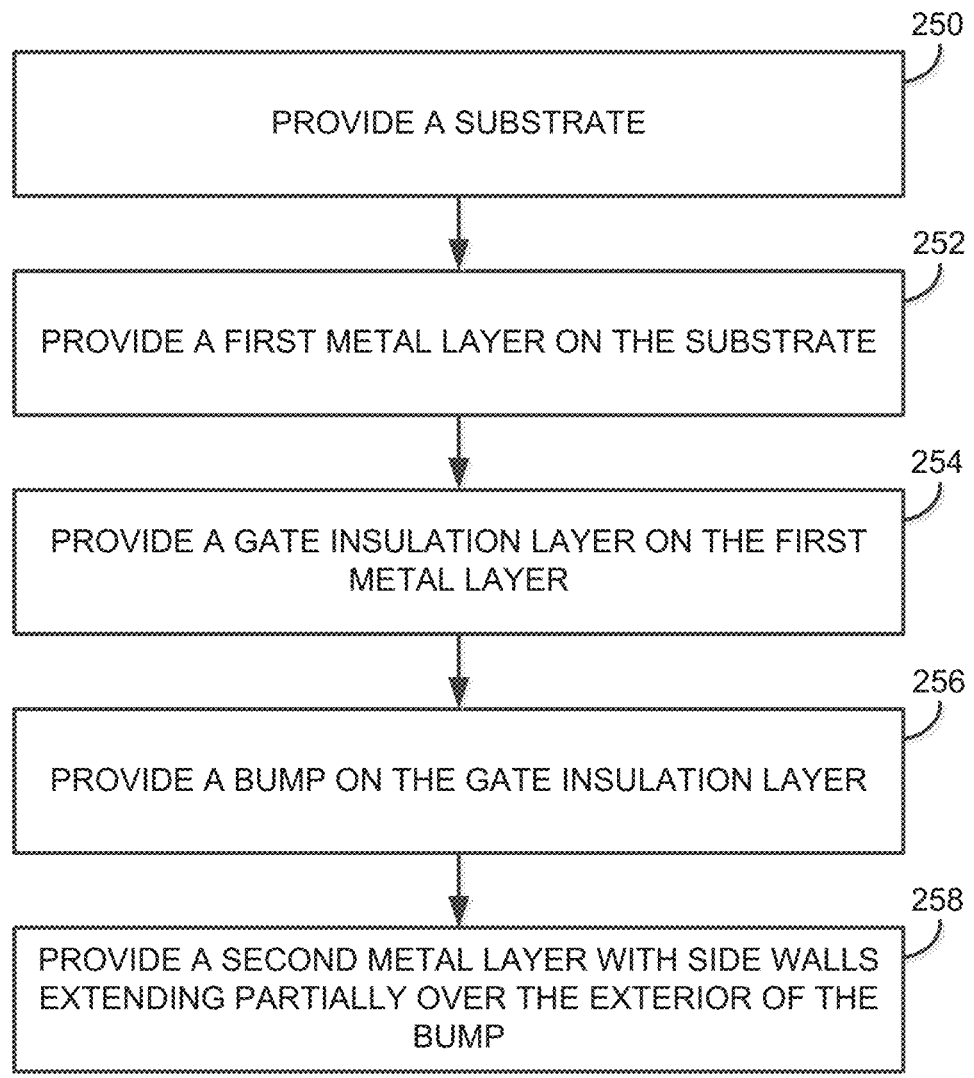
FIG. 10 is a flowchart depicting an embodiment of a method for manufacturing a display system.

A flowchart depicting an embodiment of a method for manufacturing a display system is depicted in FIG. 10. As shown in FIG. 10, the process may be construed as beginning at block 250, in which a substrate is provided. In block 252, a first metal layer is provided on the substrate for forming a gate line. Then, in block 254, a gate insulation layer is provided on the first metal layer. The metal layer and the gate insulation layer can be provided through a process such as Physical Vapor Deposition, Chemical Vapor Deposition or printing.

In block 256, a bump (e.g., a bump of organic material) is provided on the gate insulation layer. The bump can be provided through a process such as Physical Vapor Deposition, Chemical Vapor Deposition or printing. Then, as shown in block 258, a second metal layer is provided. The second metal layer can be provided through a process such as Physical Vapor Deposition, Chemical Vapor Deposition or printing. In particular, the second metal layer is configured as a data line that includes side walls extending partially over the exterior of the bump (e.g., up the sides of the bump) to form a cross-over segment. In some embodiments, formation of the side walls may be accomplished by one or more of various process steps, such as by performing a lift-off method to remove a cap formed over the top of the bump. This may involve selectively applying photoresist, upon which a portion of the second metal layer is deposited. In particular, the photoresist is located over the bump. Additional photoresist is then applied for forming various features, such as may be provided by performing a metal etch. Thereafter, all the photoresist is removed, which also lifts off the portion of the second metal layer that was formed on top of photoresist, thereby forming an aperture in the second metal layer and exposing the bump (see, FIGS. 6A-6B to 9A-9B, for example). The lift-off method may be performed through dissolving the photoresist by solvent.

By reducing capacitive and loading effects on scan and data lines of a display with a cross-over segment, scan line delay may be correspondingly reduced. As such, the desire for increased display size may be accommodated without the conventional drawbacks of luminance non-uniformity, flicker, cross-talk and/or image retention problems.

The embodiments described above are illustrative of the invention and it will be appreciated that various permutations of these embodiments may be implemented consistent with the scope and spirit of the invention.

What is claimed is:

1. A display system comprising:
   a first structure comprising:
   a plurality of scan lines extending in a first direction; and
   a plurality of data lines extending in a second direction and crossing over the scan lines at respective cross-over locations, each of the plurality of data lines having a pair of side walls spaced apart from each other at each of the cross-over locations, with each of the side walls exhibiting a first height, measured from a bottom surface of the data line to a first top surface of the data line at a first position where the data line overlies a corresponding one of the scan lines, wherein portions of the data lines not located at the cross-over locations exhibit a second height, measured from the bottom surface of the data line to a second top surface of the data line, with the first height being higher than the second height.

2. The system of claim 1, wherein the side walls extend in the second direction.

3. The system of claim 1, wherein the data lines have apertures at the cross-over locations, and inwardly-facing surfaces of the side walls partially define the respective apertures.

4. The system of claim 3, further comprising a bump disposed within each of the apertures.

5. The system of claim 4, wherein the bump is in direct contact with inwardly-facing surfaces of corresponding ones of the side walls.

6. The system of claim 1, wherein each of the data lines has opposing, linearly extending side surfaces, and corresponding outwardly-facing surfaces of the side walls extend upwardly from the side surfaces.

7. The system of claim 1, further comprising a gate insulation layer disposed between the scan lines and the data lines.

8. The system of claim 1, wherein:
   the side walls are interconnecting side walls extending across the scan lines; and
   the first structure further comprises a pair of support side walls at each of the plurality of cross-over locations, the support side walls of each of the pairs being spaced apart from each other at corresponding cross-over locations and extending in the first direction.

9. The system of claim 8, wherein the support side walls and the interconnecting side walls exhibit substantially the same height.

10. The system of claim 1, wherein, for each of the data lines, the bottom surface not located at the cross-over locations and the bottom surface at the cross-over locations are coplanar.

11. A display system comprising:
    a substrate;
    a scan line supported by the substrate and extending in a first direction;
    a data line supported by the substrate and extending in a second direction such that the data line crosses over the scan line at a cross-over location; and
    gate insulation disposed between the scan line and the data line;
    wherein the data line has a first section, a second section and an interconnect section electrically interconnecting the first section and the second section, the interconnect section being disposed at the cross-over location, the interconnect section having side walls defining an aperture, the interconnect section exhibiting a first height, measured from a bottom surface of the data line to a first top surface of the data line at a position where the data line overlies the scan line, the first section and the second section each exhibiting a second height, measured from the bottom surface of the data line to a second top surface and a third top surface of the data line, respectively, with the first height being higher than the second height.

12. The system of claim 11, wherein the aperture is rectangular in shape in plan view.

13. The system of claim 11, wherein the side walls are opposing pairs of side walls, with a first of the pairs extending in the first direction and a second of the pairs extending in the second direction.

14. The system of claim 13, wherein the first of the pairs of side walls are positioned outboard of the scan line.

15. The system of claim 13, wherein the first of the pairs of side walls are inclined inwardly toward each other.

16. The system of claim 11, further comprising organic material disposed within the aperture.

17. The system of claim 11, wherein each of the side walls exhibits a height, corresponding to a difference between the first height and the second height, of approximately 3.0 μm.

18. The system of claim 11, wherein an inward-facing surface of a first of the side walls is inclined with respect to a bottom of the aperture to exhibit an angle of between approximately 45 degrees and approximately 90 degrees.

19. The system of claim 11, wherein the bottom surface of the data line not located at the cross-over location and the bottom surface of the data line at the cross-over location are coplanar.

* * * * *